US012618143B2

(12) United States Patent
Ren et al.

(10) Patent No.: US 12,618,143 B2
(45) Date of Patent: May 5, 2026

(54) VACUUM COATING APPARATUS FOR UNIFORMLY DISTRIBUTING METAL VAPOR USING UNIFORM MIXING BUFFER STRUCTURE

(71) Applicant: BAOSHAN IRON & STEEL CO., LTD., Shanghai (CN)

(72) Inventors: Sanbing Ren, Shanghai (CN); Fei Xiong, Shanghai (CN); Junfei Fan, Shanghai (CN); Yueming Zhou, Shanghai (CN); Shanqing Li, Shanghai (CN)

( * ) Notice: Subject to any disclaimer, the term of this patent is extended or adjusted under 35 U.S.C. 154(b) by 659 days.

(21) Appl. No.: 18/016,407

(22) PCT Filed: Jul. 21, 2021

(86) PCT No.: PCT/CN2021/107686
   § 371 (c)(1),
   (2) Date: Jan. 16, 2023

(87) PCT Pub. No.: WO2022/017425
   PCT Pub. Date: Jan. 27, 2022

(65) Prior Publication Data
   US 2023/0323526 A1      Oct. 12, 2023

(30) Foreign Application Priority Data

Jul. 21, 2020    (CN) ........................ 202010702653.X

(51) Int. Cl.
   *C23C 14/54*        (2006.01)
   *B01L 3/04*         (2006.01)
   (Continued)

(52) U.S. Cl.
   CPC ................ *C23C 14/54* (2013.01); *B01L 3/04* (2013.01); *C23C 14/00* (2013.01); *C23C 14/14* (2013.01);
   (Continued)

(58) Field of Classification Search
   CPC . Y02P 10/25; B01L 3/04; C23C 14/54; C23C 14/00; C23C 14/14; C23C 14/228;
   (Continued)

(56) References Cited

U.S. PATENT DOCUMENTS

2008/0216749 A1    9/2008   Aulbach
2009/0304906 A1    12/2009  Suduo et al.

FOREIGN PATENT DOCUMENTS

CN       20628925 U       6/2017
CN       107815648 A      3/2018
   (Continued)

OTHER PUBLICATIONS

International Search Report and Written Opinion in connection with international application PCT/CN2020/107686 issued from the China National Intellectual Property Administration on Oct. 20, 2021.
   (Continued)

*Primary Examiner* — Rodney G McDonald
(74) *Attorney, Agent, or Firm* — Elizabeth L. Neal; DeWitt LLP

(57) ABSTRACT

Disclosed in the present invention is vacuum coating apparatus for uniformly distributing metal steam using a uniform mixing buffer structure, comprising a crucible, wherein an induction heater for heating molten metal in the crucible to form metal steam is arranged outside of the crucible. A top of the crucible is connected to a flow distribution tank body by means of a metal steam pipeline. A horizontal core rod and a pressure stabilizing plate are arranged inside the flow distribution tank body. The core rod is located below the pressure stabilizing plate. A coating nozzle is arranged at the top of the flow distribution tank body. An induction coil is arranged on the outer side of the flow distribution tank body. A pressure regulating valve is arranged on the metal steam pipeline. A plurality of axial heating holes are provided
   (Continued)

inside the core rod, resistance wires are arranged inside the heating holes, and a primary guide plate, a secondary guide plate and a tertiary guide plate are arranged on the surface of the core rod; and a buffer groove is provided on the inner wall of the flow distribution tank body, and the buffer groove corresponds to the core rod in position. According to the present invention, when high-temperature steam makes contact with a low-temperature steel plate, a uniform coating is formed on the surface of the steel plate.

18 Claims, 6 Drawing Sheets

(51) Int. Cl.

| | | |
|---|---|---|
| *C23C 14/00* | (2006.01) | |
| *C23C 14/14* | (2006.01) | |
| *C23C 14/22* | (2006.01) | |
| *C23C 14/24* | (2006.01) | |
| *C23C 14/26* | (2006.01) | |
| *C23C 14/56* | (2006.01) | |
| *H01J 37/32* | (2006.01) | |

(52) U.S. Cl.
CPC .......... *C23C 14/228* (2013.01); *C23C 14/243* (2013.01); *C23C 14/26* (2013.01); *C23C 14/56* (2013.01); *H01J 37/32458* (2013.01)

(58) Field of Classification Search
CPC ....... C23C 14/243; C23C 14/26; C23C 14/56; C23C 14/16; C23C 14/24; C23C 14/562
USPC ......................................................... 118/726
See application file for complete search history.

(56) References Cited

FOREIGN PATENT DOCUMENTS

| CN | 109487216 | A | 3/2019 |
|---|---|---|---|
| CN | 107815648 | B | 11/2019 |
| CN | 210765480 | U | 6/2020 |
| JP | 2011127137 | A | 6/2011 |
| JP | 2015010257 | A | 1/2015 |
| KR | 20150034452 | A | 4/2015 |
| WO | 2014168352 | A1 | 10/2014 |

OTHER PUBLICATIONS

First Office Action issued in connection with the CN application No. 202010702653.X on May 18, 2022, from the Chinese Patent Office.
First Search in connection with the CN application No. 202010702653.X issued May 11, 2022.
"Extended European Search Report received for European Patent Application No. 21846132.5, mailed on Nov. 23, 2023", 11 pages.
"Korean Office Action received for Korean Patent Application No. 10-2023-7001095 mailed on Jan. 13, 2025", 5 pages (2 pages of English Translation and 3 pages of offical copy).

9

8

10

$S_{outlet}$ $S_{total\ hole\ area}$ $S_{inlet}$

Molten metal

VACUUM COATING APPARATUS FOR UNIFORMLY DISTRIBUTING METAL VAPOR USING UNIFORM MIXING BUFFER STRUCTURE

CROSS-REFERENCE TO RELATED APPLICATIONS

The present application is the U.S. National Stage application of International Application No. PCT/CN2021/107686, filed Jul. 21, 2021, which International Application was published on Jan. 27, 2022, as International Publication No. WO2022/017425. The International Application claims priority to Chinese Patent Application No. 202010702653.X, filed Jul. 21, 2020, the contents of which are incorporated herein by reference in their entireties.

TECHNICAL FIELD

The present invention relates to the technical field of vacuum coating, and more particularly, relates to vacuum coating apparatus for uniformly distributing metal steam using a uniform mixing buffer structure.

BACKGROUND

Physical vapor deposition (PVD) refers to a process technique that a plated metal is heated under vacuum conditions, so that it is deposited in a gaseous state onto a substrate to form a coating, and depending on different heating modes, it is classified as (resistive or inductive) electric heating, electron beam gun heating (EBPVD), or the like. Vacuum coating, serving as a surface modification and coating process, has been widely applied in electronic, glass, plastic, and other industries, and the vacuum coating technology has main advantages that it is environmental, has good coating performance, and achieves a diversity in plated materials. The key to the use of the vacuum coating technology for continuous strip steel lies in several aspects such as continuous coating production, large-scale production, high-rate production, mass production, etc. Since the 1980s, much research has been conducted on the technology by respective steel companies in the world. The technology is receiving unprecedented attention and is considered to be an innovative surface coating process as the hot galvanizing technology and the electro galvanizing technology become mature.

A key point in vacuum coating is how to obtain a coating with a uniform thickness by arranging the nozzle. The documents disclosed abroad at present mainly involve the following aspects.

1) An integrated evaporation crucible and flow distribution nozzle structure The European patents BE1009321A6 and BE1009317A61 respectively disclose crucible nozzle structures as shown in FIG. 1 and FIG. 2. In the structure of FIG. 1, an upper cover 2 is added on an upper part of a crucible 1 such that a nozzle structure is formed between the upper cover 2 and a furnace wall for direct spraying of evaporated metal. In the structure of FIG. 2, a filter plate 3 is added in the evaporation crucible, and then a slit nozzle at the top is used for spraying the metal steam. In the designs of these two device nozzles, one nozzle employs a Laval nozzle structure, and the other nozzle employs a converging nozzle, and one nozzle is located for lateral spraying, and the other nozzle is located for vertical spraying.

The patents JPS59177370A and U.S. Pat. No. 4,552,092A also disclose related evaporation crucible and nozzle structure. FIG. 3 shows a crucible nozzle structure which can automatically replenish a molten metal. A nozzle 4 adopts a wider outlet, and a heater 5 is also arranged at an upper part of the crucible and is used to heat for obtaining a steam, or the like. In the crucible nozzle structure shown in FIG. 4, the structure extends as an arc 6 at one side and achieves a lateral spraying, and a heating pipeline 7 is likewise arranged outside of the crucible wall, for heating the wall surface.

2) A separated evaporation crucible and flow distribution nozzle structure The patent WO2018/020311A1 discloses a separated crucible nozzle structure, as shown in FIG. 5, in which a bottom part of a crucible is connected to a molten metal feed tank 8, and an upper part of the crucible delivers a metal steam through a separated pipeline 9 into a tubular distributor and a steam nozzle which is at a front end, and then the metal steam is sprayed to a steel plate at a high velocity through the nozzle.

The patent CN103249860A discloses a separated flow distributor and nozzle structure.

As shown in FIG. 6, the steam is delivered into an upper horizontal pipeline 10 through a pipeline, and a top part of the horizontal pipeline 10 is provided with a porous nozzle for uniformly spraying a metal steam onto a surface of a metal plate.

The patent CN101175866A discloses a form of a metal steam flow distributor and nozzle. FIG. 7 shows a cross section of the nozzle; a wire is wound outside of a flow distributor pipeline 11 to heat the pipeline; the nozzle has a square housing, as shown in FIG. 8; a circular pipeline made of another material is nested inside the square housing 12 and is used for spraying a metal steam; and a steam outlet used in the nozzle is porous.

These patents are all related to specific forms of the nozzles in the coating process, but cannot indicate that these nozzles can achieve uniform coating. The coating uniformity of the surface of a steel plate is a key factor for a subsequent process such as bending and punching.

SUMMARY

In view of the above-mentioned drawbacks existing in the prior art, an objective of the present application is to provide vacuum coating apparatus for uniformly distributing metal steam using a uniform mixing buffer structure, wherein metal steam is uniformly distributed and guided by using a uniform mixing groove, is subjected to secondary buffered distribution by using a pressure stabilizing plate, and then is sprayed from a coating nozzle to finally form a uniform coating on a surface of a steel plate.

In order to achieve the above objects, the present invention employs the following technical solutions.

Vacuum coating apparatus for uniformly distributing a metal steam using a uniform mixing buffer structure comprises a crucible. An induction heater for heating molten metal in the crucible to form metal steam is arranged outside the crucible; a top of the crucible is connected to a flow distribution tank body by a metal steam pipeline; a uniform mixing groove and a pressure stabilizing plate, which extend in a horizontal direction, are arranged inside the flow distribution tank body; the uniform mixing groove is located below the pressure stabilizing plate; a coating nozzle is arranged on top of the flow distribution tank body; an induction coil is arranged outside the flow distribution tank body; and a pressure regulating valve is arranged on the metal steam pipeline.

The uniform mixing groove is provided in a shape of a circular arc plate, and has a concave arc surface facing the metal steam pipeline; one or more heating holes extending in an axial direction of the uniform mixing groove are formed in the uniform mixing groove; the uniform mixing groove is provided with an overflow hole, and the overflow hole penetrates through the uniform mixing groove in a radial direction of the uniform mixing groove.

A buffer groove is formed in an inner wall of the flow distribution tank body, corresponds to the uniform mixing groove in position, and is provided with a plurality of deceleration walls therein.

Optionally, the buffer groove is arranged opposite to the uniform mixing groove in the horizontal direction such that the buffer groove corresponds to the uniform mixing groove in position.

Preferably, the overflow hole is provided as a circular hole, an elliptical hole, a trapezoidal hole or a rectangular hole.

Optionally, a plurality of overflow holes are provided, and include a combination of one or more of a circular hole, an elliptical hole, a trapezoidal hole or a rectangular hole.

Preferably, the overflow opening of the overflow hole is provided in a shape of a continuous overflow slit.

Preferably, a cross section of the buffer groove is set to be rectangular or trapezoidal.

Preferably, the deceleration wall is set to be of a rectangular strip shape or a trapezoidal strip shape with a porous structure.

Preferably, 1-10 deceleration walls are provided.

Preferably, a total area $S_{overflow}$ of the overflow opening of the overflow hole in the uniform mixing groove, a total area $S_{inflow}$ of an airflow inlet channel of the uniform mixing groove, a distance D2 from the top of the deceleration wall to an outer surface of the uniform mixing groove, the number of the deceleration walls, a porosity P1 of the deceleration wall, a distance DW between two adjacent deceleration walls, total power W1 of the resistance wires, and the pressure of the metal steam in the metal steam pipeline satisfy the following relationship:

the pressure of the metal steam in the metal steam pipeline is 5000-100000 Pa, $S_{inflow}/S_{overflow}$=0.5-4, D2=3-10 mm, DW=10-30 mm, the number of the deceleration walls is set to be 1-10, the deceleration wall is set to be of a continuous strip shape, the porosity of the deceleration wall is set to be 0.2-0.7, and the resistance wires have the total power W1=1-10 KW/m.

Optionally, in some embodiments, as the pressure of the metal steam in the metal steam pipeline is increased, a value of $S_{inflow}/S_{overflow}$ is increased, a value of D2 is increased, a value of DW is increased, the number of the deceleration walls is increased, the deceleration wall is set to be of the continuous strip shape, the porosity of the deceleration wall is reduced, and the total power W1 of the resistance wires is increased.

Optionally, in some embodiments, when the pressure of the metal steam in the metal steam pipeline is 50000-100000 Pa, $S_{inflow}/S_{overflow}$=2-4, D2=7-10 mm, DW=20-30 mm, the number of the deceleration walls is set to be 6-10, the deceleration wall is set to be of the continuous strip shape, the porosity of the deceleration wall is set to be 0.2-0.3, and the resistance wires have the total power W1=7-10 KW/m; when the pressure of the metal steam in the metal steam pipeline is 10000-50000 Pa, $S_{inflow}/S_{overflow}$=1-2, D2=5-7 mm, DW=15-20 mm, the number of the deceleration walls is set to be 4-6, the deceleration wall is set to be of the continuous strip shape, the porosity of the deceleration wall is set to be 0.3-0.5, and the resistance wires have the total power W1=5-7 KW/m; and when the pressure of the metal steam in the metal steam pipeline is 5000-10000 Pa, $S_{inflow}/S_{overflow}$=0.5-1, D2=3-5 mm, DW=10-15 mm, the number of the deceleration walls is set to be 1-4, the deceleration wall is set to be of the continuous strip shape, the porosity of the deceleration wall is set to be 0.5-0.7, and the resistance wires have the total power W1=1-5 KW/m.

Preferably, the pressure stabilizing plate is set to be of a porous structure, a ratio of a total hole area $S_{total\ hole\ area}$ of the pressure stabilizing plate to an airflow channel area $S_{outlet}$ at an outlet of the coating nozzle is greater than or equal to 0.1, i.e., $S_{total\ hole\ area}/S_{outlet} \geq 0.1$.

Preferably, the holes in the pressure stabilizing plate are circular, square or triangular.

Preferably, the holes in the pressure stabilizing plate extend in a straight or curved line.

Preferably, an outlet of the coating nozzle is set to be of a slit type or a porous type, and the airflow channel area at the outlet of the coating nozzle is $S_{outlet}$, and an airflow channel area at an interface of the top of the crucible and the metal steam pipeline is $S_{inlet}$, wherein a ratio of $S_{outlet}$ to $S_{inlet}$ is greater than or equal to 0.05-5, i.e., $S_{outlet}/S_{inlet} \geq 0.05$-5.

Preferably, the coating nozzle is set to be of the slit type, and has a straight or curved profile; or, the coating nozzle is set to be of the porous type, and has a rectangular, circular, or trapezoidal profile.

Preferably, the uniform mixing groove is connected to the flow distribution tank body by means of threads or inlaying.

The present application provides the vacuum coating apparatus for uniformly distributing a metal steam using a uniform mixing buffer structure. The metal steam is obtained by melting and evaporating the molten metal in the crucible by induction heating of the induction heater; the metal steam enters the flow distribution tank body through the metal steam pipeline; the induction coil is arranged outside the flow distribution tank body for heating, and the uniform mixing groove is arranged inside the flow distribution tank body, and is fixed inside the flow distribution tank body by means of threads or inlaying, and the axial heating holes are formed in the uniform mixing groove and are heated by the resistance wires. According to the evaporating temperature of the metal steam, and after the coating nozzle and the uniform mixing groove are heated to the desired temperature, the pressure regulating valve is opened, and the metal steam enters the flow distribution tank body and impacts onto the uniform mixing groove. A part of the metal steam flows into the flow distribution tank body after flowing to an edge of the uniform mixing groove, and the other part of the metal steam enters the uniform mixing groove to be distributed; the overflow openings are formed in the uniform mixing groove and distribute the flow in cooperation with the buffer groove in the inner wall of the flow distribution tank body, so that the metal steam inside the uniform mixing groove is distributed to the edge of the uniform mixing grooves, converges with the metal steam directly flowing to the flow distribution tank and flows into the flow distribution tank. The pressure stabilizing plate is arranged inside the flow distribution tank body for the secondary buffered distribution of the metal steam entering a distribution cavity. Then the metal steam is sprayed out from the coating nozzle and contacts a preprocessed metal plate at high velocity, thereby forming a uniform metal coating.

DETAILED DESCRIPTION

The technical solutions of embodiments of the present application are further described below in connection with the accompanying drawings.

Figure 1:
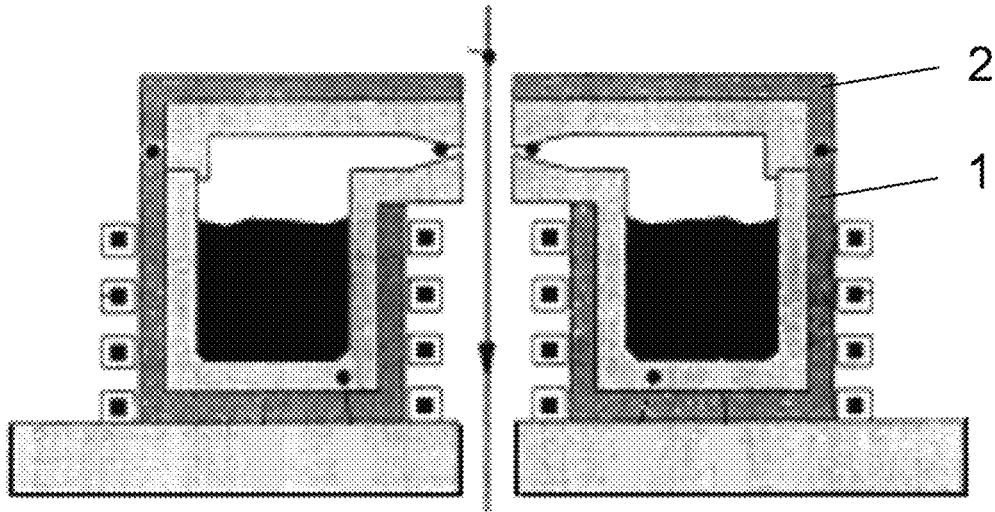
FIG. 1 is a schematic diagram of the European patent BE1009321A6.
Figure 2:
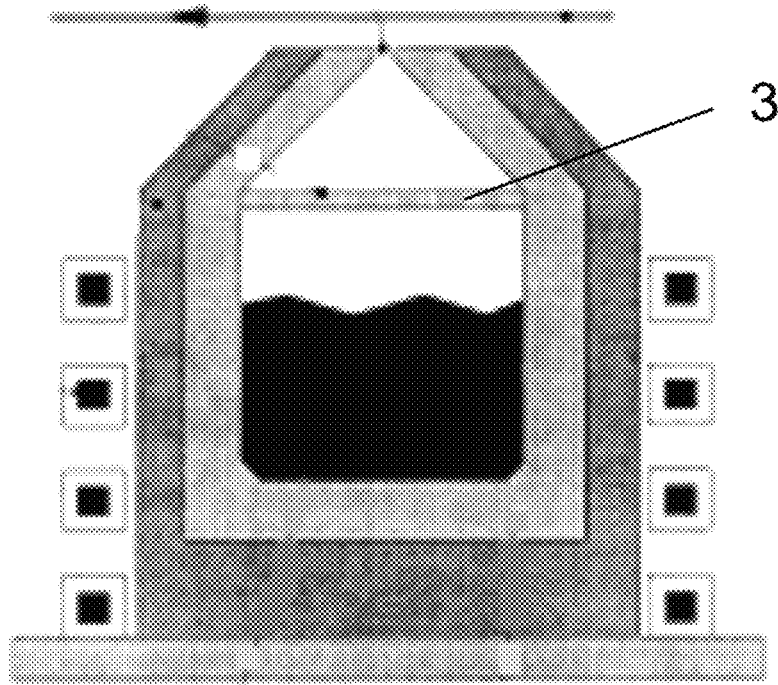
FIG. 2 is a schematic diagram of the European patent BE1009317A61.
Figure 3:
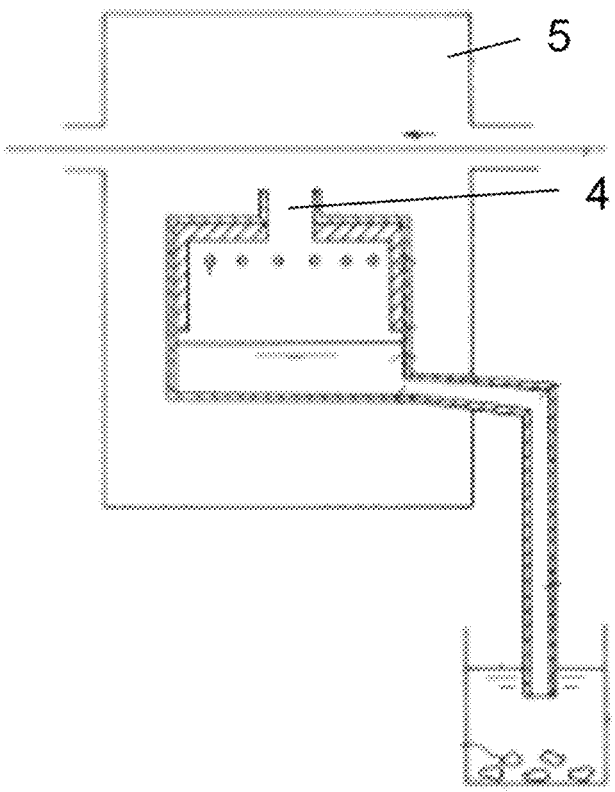
FIG. 3 is a schematic diagram of the patent JPS59177370A.
Figure 4:
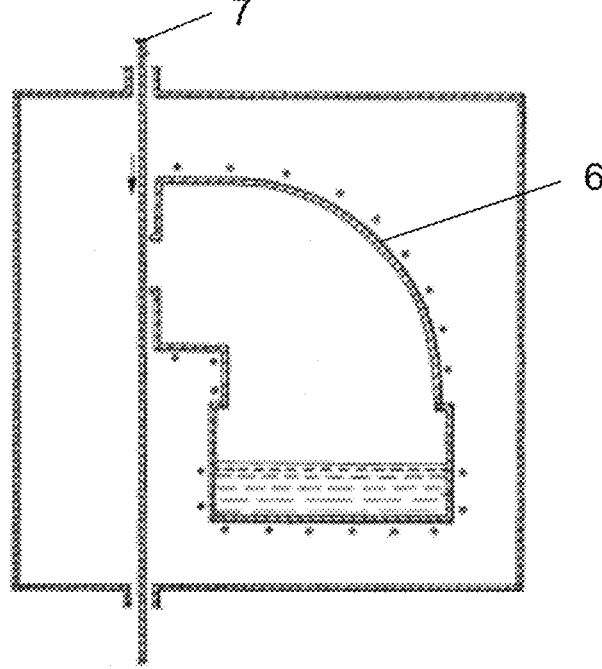
FIG. 4 is a schematic diagram of the patent U.S. Pat. No. 4,552,092A.
Figure 5:
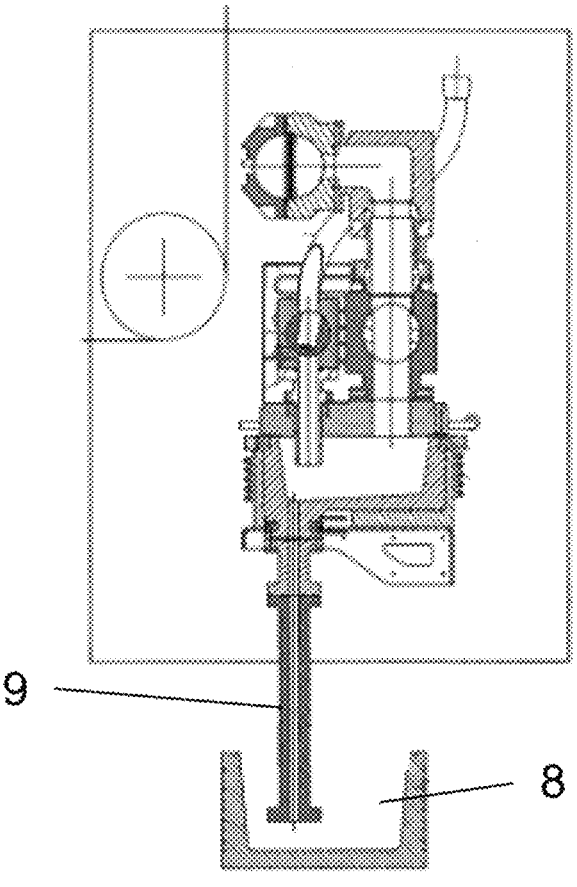
FIG. 5 is a schematic diagram of the patent WO2018/ 020311A1.
Figure 6:
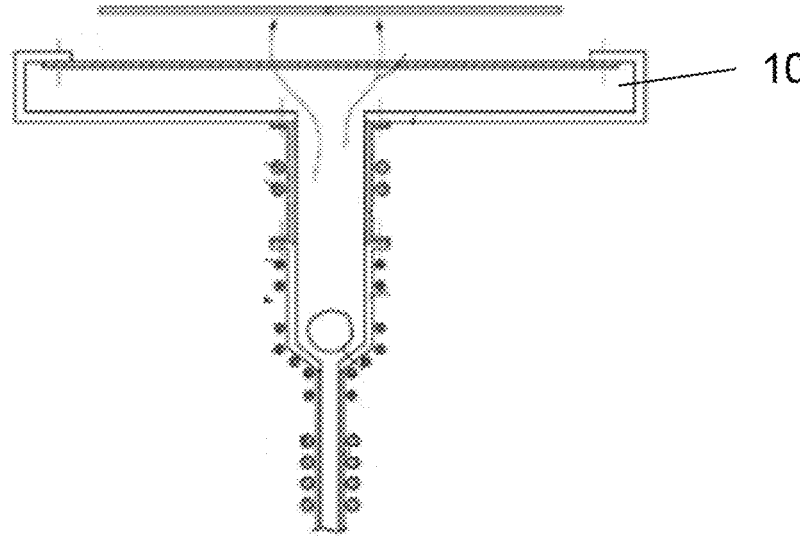
FIG. 6 is a schematic diagram of the patent CN103249860A.
Figure 7:
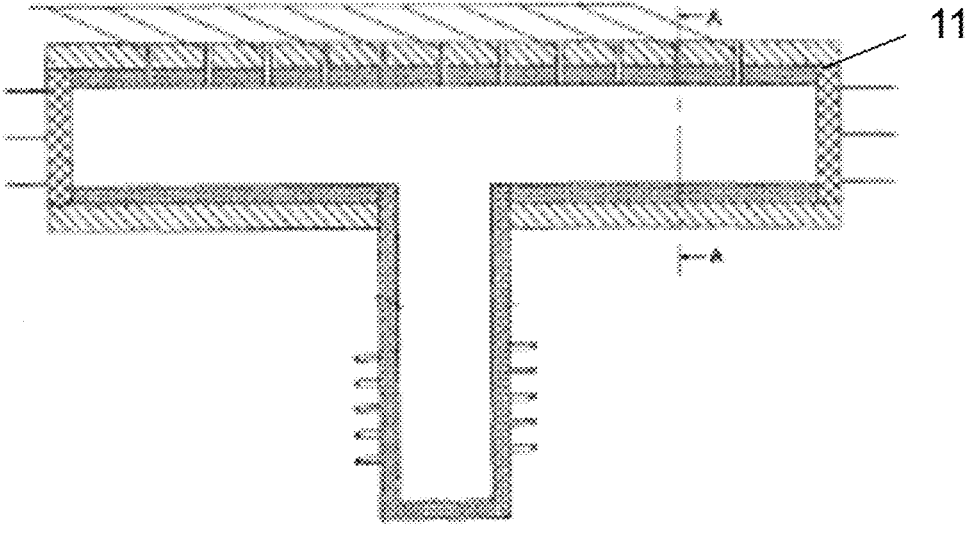
FIG. 7 is a schematic diagram of the patent CN101175866A.
Figure 8:
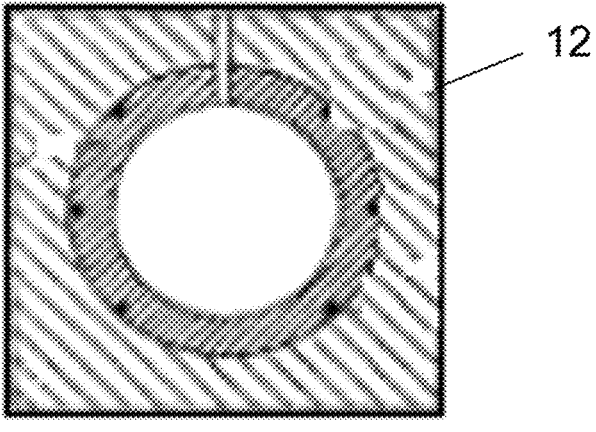
FIG. 8 is a schematic diagram of a square housing of FIG. 7.
Figure 9:
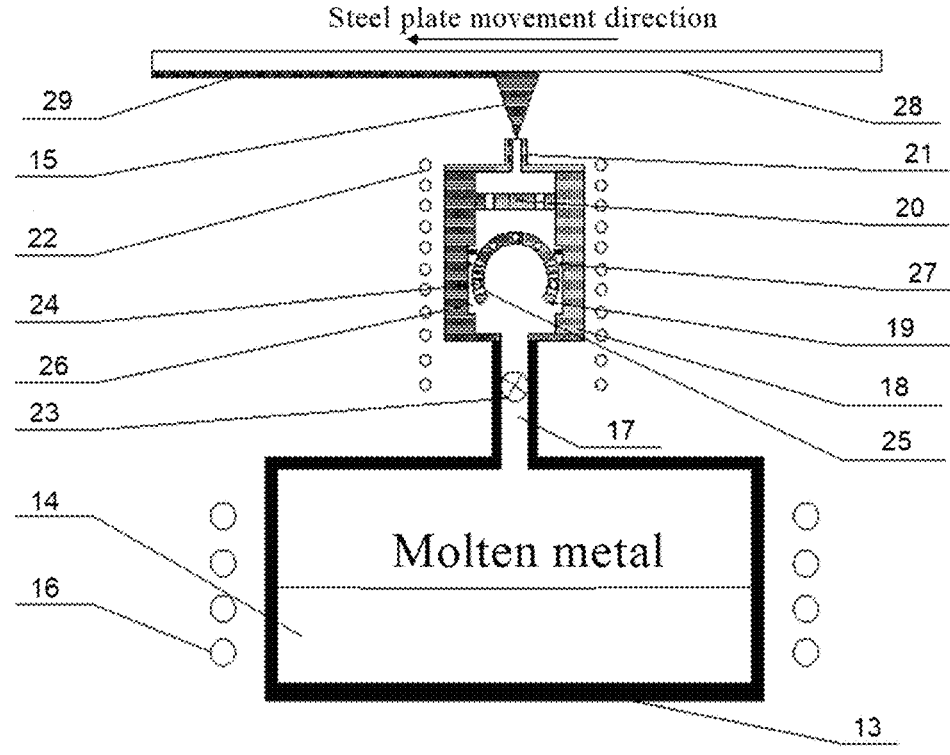
FIG. 9 is a schematic structural diagram of vacuum coating apparatus provided by an embodiment of the present application.

Referring to FIG. 9, an embodiment of the present application provides a vacuum coating apparatus for uniformly distributing metal steam using a uniform mixing buffer structure, including a crucible 13. An induction heater 16 for heating molten metal 14 in the crucible 13 to form a metal steam 15 is arranged outside the crucible 13. A top of the crucible 13 is connected to a flow distribution tank body 18 by a metal steam pipeline 17. A uniform mixing groove 19 and a pressure stabilizing plate 20, which are oriented horizontally, are arranged inside the flow distribution tank body 18. The uniform mixing groove 19 is located below the pressure stabilizing plate 20. The uniform mixing groove 19 is connected to the flow distribution tank body 18 by means of threads or inlaying. A coating nozzle 21 is arranged on top of the flow distribution tank body 18. An induction coil 22 is arranged outside the flow distribution tank body 18. A pressure regulating valve 23 is arranged on the metal steam pipeline 17.

The uniform mixing groove 19 is provided in a shape of a circular arc plate, and has a concave arc surface 19a facing the metal steam pipeline 17. One or more heating holes 24 are formed in the uniform mixing groove 19, and extend in an axial direction of the uniform mixing groove 19 (a direction perpendicular to the paper surface of FIGS. 9 and 10). A resistance wire is arranged inside each heating hole 24. In an example shown in FIGS. 9 and 10, the number of the heating holes 24 is five, but the present application is not limited thereto. In other examples, there may be other number of the heating holes 24, for example, 1, 3, 7, 10, etc.

Figure 10:
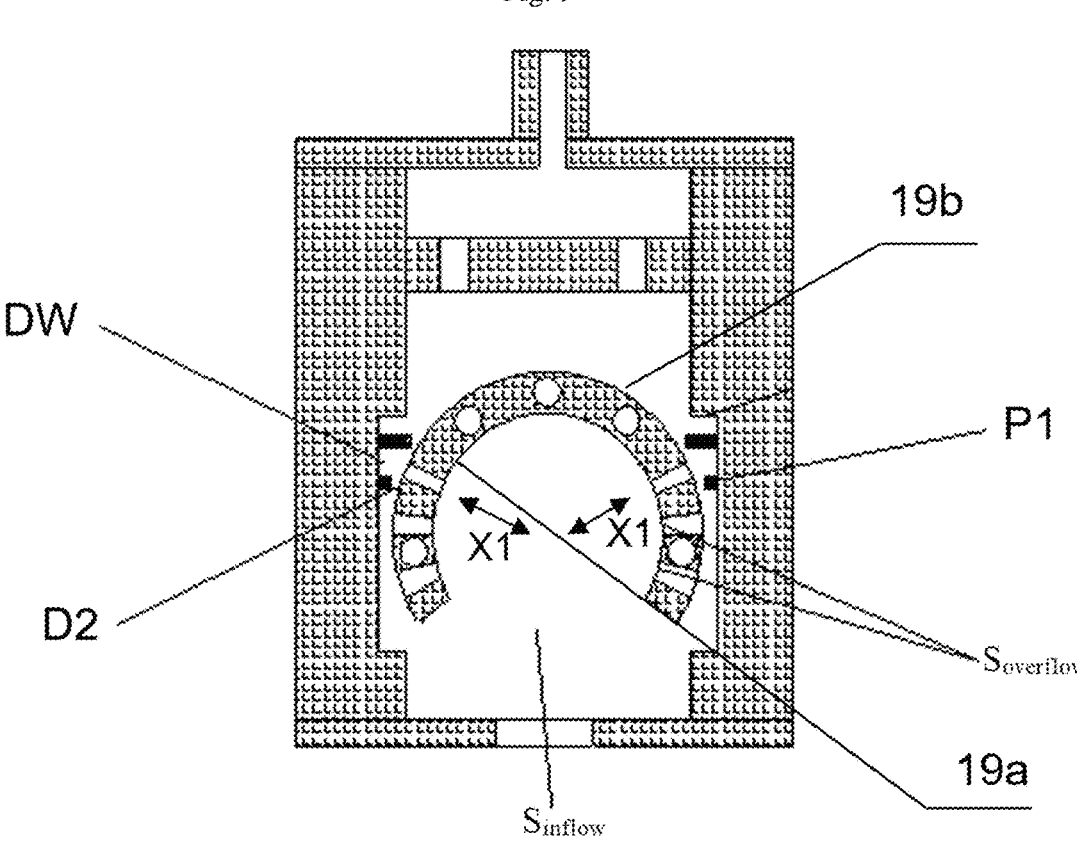
FIG. 10 is a schematic diagram of positional parameters for a total area $S_{overflow}$ of overflow openings of overflow holes in a uniform mixing groove, a total area $S_{inflow}$ of an airflow inlet channel of the uniform mixing groove, a distance D2 from the top of a deceleration wall to an outer surface of the uniform mixing groove, a porosity P1 of the deceleration wall, a distance DW between two adjacent deceleration walls in a vacuum coating apparatus provided by an embodiment of the present application.

An overflow hole 25 is formed in the uniform mixing groove 19, and penetrates through the uniform mixing groove 19 in an axial direction of the mixing groove 19 (a direction X1 shown in FIG. 10, i.e., a radius direction of the circular arc plate). The uniform mixing groove 19 mainly plays the role of performing a primary uniform mixing distribution of the metal steam 15 entering the flow distribution tank body 18 from the metal steam pipeline 17 such that the metal steam 15 flows in a length direction of the uniform mixing groove 19 (i.e., the axial direction of the uniform mixing groove 19).

The overflow hole 25 may be provided as a circular hole, an elliptical hole, a trapezoidal hole or a rectangular hole. In some embodiments, a plurality of overflow holes 25 are provided, and may include a combination of one or more of a circular hole, an elliptical hole, a trapezoidal hole or a rectangular hole.

An overflow opening of the overflow hole 25, (i.e., an opening of the overflow hole 25 in an outer peripheral surface 19b of the uniform mixing groove 19), may also be provided in a shape of a continuous overflow slit.

The overflow opening 25 is primarily used for causing the metal steam entering the uniform mixing groove 19 to be distributed and flow out uniformly.

A buffer groove 26 is formed in an inner wall of the flow distribution tank body 18, corresponds to the uniform mixing groove 19 in position, and is provided with 1-10 deceleration walls 27 therein. Exemplarily, the buffer groove 26 is arranged opposite to the uniform mixing groove 19 in the horizontal direction such that the buffer groove 26 corresponds to the uniform mixing groove 19 in position.

The buffer groove 26 is a concave groove formed in the inner wall of the flow distribution tank body 18, and a cross section of the concave groove may be trapezoidal, rectangular or be in other shapes. For example, in an example provided in FIG. 10, the cross section of the buffer groove 26 is rectangular.

The deceleration wall 27 is in a convex body arranged on the inner wall of the buffer groove 26, has a rectangle or trapezoid shape, or other shapes, and is mainly used for the buffered distribution of the metal steam 15 entering the buffer groove 26 and flowing to the flow distribution tank body 18.

The workflow of the vacuum coating apparatus of the present invention is as follows:

1) A metal block is melted in the crucible 13 under the action of the induction heater 16 to form a molten metal 14, and the molten metal 14 starts to vaporize under higher superheat and low pressure, thereby gradually forming a metal steam 15;

2) At a beginning stage, the pressure regulating valve 23 on the metal steam pipeline 17 connected to the crucible 13 is in a closed state. The metal steam 15 in an inner cavity of the crucible 13 is constantly increased as the molten metal 14 is constantly vaporized, and when the pressure in the inner cavity of the crucible 13 reaches a certain value, the pressure regulating valve 23 is opened to keep it flowing out at a certain pressure;

3) At the moment, the power of the induction heater 16 needs to be increased such that the reduced pressure, due to the pressure regulating valve 23 being opened, is supplemented; the power range of the induction heater 16 is adjusted such that the pressure of the metal steam 15 in the inner cavity of the crucible 13 is kept to be within a constant range;

4) After the pressure regulating valve 23 is opened, the metal steam 15 flows forward along the metal steam pipeline 17; when the metal steam 15 enters the flow distribution tank body 18, a part of the metal steam 15 directly enters the uniform mixing groove 19, and the other part of the metal steam 15 bypasses the uniform mixing groove 19 and flows out from a gap between an outer surface of the uniform mixing groove 19 and the buffer groove 26;

5) The radial overflow hole 25 is formed in the uniform mixing groove 19, and the metal steam 15 entering the uniform mixing groove 19 spreads in the length direction of the uniform mixing groove 19, and flows out through the overflow hole 25, and impacts onto the flow distribution tank body 18 to create a primary uniform mixing buffered distribution of the metal steam 15;

6) The buffer groove 26 is formed in a position, corresponding to the uniform mixing groove 19, of the inner wall of the flow distribution tank body 18. The deceleration wall 27 is arranged inside the buffer groove 26. The metal steam 15 bypassing the uniform mixing groove 19 and the metal steam 15 flowing out of the overflow hole 25 are mixed in the buffer groove 26, thereby counteracting the velocities therebetween; and the metal steam 15 flows out along the deceleration wall 27 in the buffer groove 26, and enters the flow distribution tank body 18, thereby forming secondary buffer of the metal steam 15;

7) the heating holes 24 provided with the resistance wires are arranged inside the uniform mixing groove 19 to heat the uniform mixing groove 19 during operation, so that the flowing metal steam 15 cannot be solidified. The induction coil 22 is arranged outside the flow distribution tank body 18 to heat the entire flow distribution tank body 18, so that the temperature in the flow distribution tank body 18 is maintained constantly and the metal steam 15 inside the flow distribution tank body 18 cannot be solidified while flowing;

8) The pressure stabilizing plate 20 is installed in the flow distribution tank body 18 and is used for secondary buffered distribution of the airflow of the metal steam 15 entering a distribution cavity, and then the uniform metal steam 15 flows out uniformly from the coating nozzle 21 on the top of the flow distribution tank body 18;

9) due to the narrow outlet of the coating nozzle 21, a greater velocity is formed when the metal steam 15 flows out; and at the moment, a moving steel plate 28 is arranged above the coating nozzle 21, and due to the higher temperature of the metal steam 15, the metal steam 15 is rapidly solidified when encountering the steel plate 28 having a lower temperature, thereby forming a metal coating 29.

The molten metal 14 may include metals such as zinc, magnesium, aluminum, tin, nickel, copper and iron, and in addition, may also include low-melting-point (less than 2000° C.) oxides of these elements.

The steel plate 28 is cleaned by a plasma device or other devices before the vacuum coating, and its preheating temperature reaches 80-300° C.

Referring to FIG. 10 again, a total area $S_{overflow}$ of the overflow opening of the overflow hole 25 in the uniform mixing groove 19, a total area $S_{inflow}$ of an airflow inlet channel of the uniform mixing groove 19, a distance D2 from the top of the deceleration wall 27 to the outer surface of the uniform mixing groove 19, the number of the deceleration walls 27, a porosity P1 of the deceleration wall 27, a distance DW between two adjacent deceleration walls 27, a total power W1 of the resistance wires, and the pressure of the metal steam 15 in the metal steam pipeline 17 satisfy the following relationship:

the pressure of the metal steam 15 in the metal steam pipeline 17 is 5000-100000 Pa, $S_{inflow}/S_{overflow}=0.5\text{-}4$, D2=3-10 mm, DW=10-30 mm, the number of the deceleration walls is set to be 1-10, the deceleration wall is set to be of a continuous strip shape, the porosity of the deceleration wall is set to be 0.2-0.7, and the resistance wires have the total power W1=1-10 KW/m.

Optionally, in some embodiments, as the pressure of the metal steam 15 in the metal steam pipeline 17 is increased, a value of $S_{inflow}/S_{overflow}$ is increased, a value of D2 is increased, a value of DW is increased, the number of the deceleration walls is increased, the deceleration wall is set to be of the continuous strip shape, the porosity of the deceleration wall is reduced, and the total power W1 of the resistance wires is increased.

Optionally, in some embodiments, when the pressure of the metal steam 15 in the metal steam pipeline 17 is 50000-100000 Pa, $S_{inflow}/S_{overflow}=2\text{-}4$, D2=7-10 mm, DW=20-30 mm, the number of the deceleration walls 27 is set to be 6-10, the deceleration wall 27 is set to be of the continuous strip shape, the porosity of the deceleration wall 27 is set to be 0.2-0.3, and the resistance wires have the total power W1=7-10 KW/m;

when the pressure of the metal steam 15 in the metal steam pipeline 17 is 10000-50000 Pa, $S_{inflow}/S_{overflow}=1\text{-}2$, D2=5-7 mm, DW=15-20 mm, the number of the deceleration walls 27 is set to be 4-6, the deceleration wall 27 is set to be of a continuous strip shape, the porosity of the deceleration wall 27 is set to be 0.3-0.5, and the resistance wires have the total power W1=5-7 KW/m;

when the pressure of the metal steam 15 in the metal steam pipeline 17 is 5000-10000 Pa, $S_{inflow}/S_{overflow}=0.5\text{-}1$, D2=3-5 mm, DW=10-15 mm, the number of the deceleration walls 27 is set to be 1-4, the deceleration wall 27 is set to be of a continuous strip shape, the porosity of the deceleration wall 27 is set to be 0.5-0.7, and the resistance wires have the total power W1=1-5 KW/m.

Figure 11:
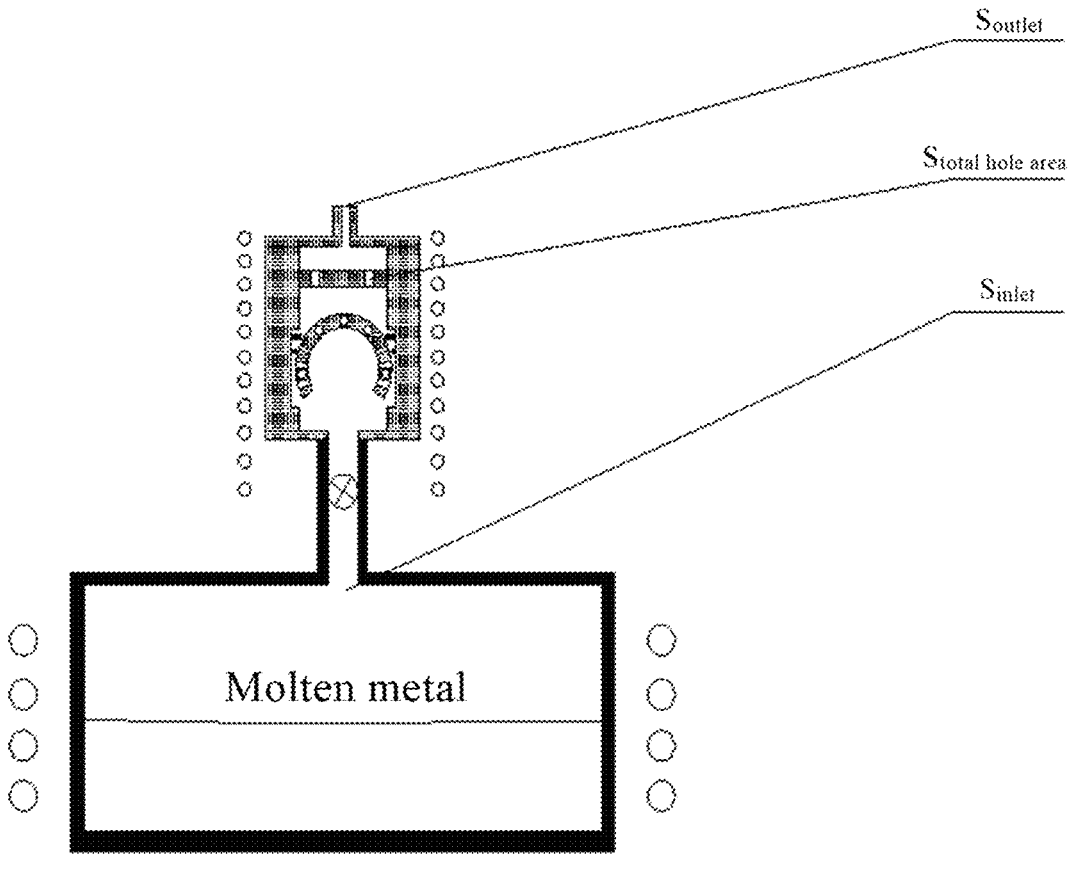
FIG. 11 is a schematic diagram of parameter area classifications in the vacuum coating apparatus of FIG. 9.

Please refer to FIG. 11, the pressure stabilizing plate 20 is set to be of a porous structure, and a ratio of a total hole area $S_{total\ hole\ area}$ of the pressure stabilizing plate 20 to an airflow channel area $S_{outlet}$ at the outlet of the coating nozzle 21 is greater than or equal to 0.1, i.e., $$S_{total\ hole\ area}/S_{outlet}\geq0.1.$$

The holes in the pressure stabilizing plate 20 are circular, square, triangular or are of other shapes.

The holes in the pressure stabilizing plate 20 extend in various forms, such as a straight line, a curved line, or a multi-layer structure.

The outlet of the coating nozzle 21 is set to be of a slit type or a porous type, and the airflow channel area at the outlet of the coating nozzle 21 is $S_{outlet}$. An airflow channel area at an interface of the top of the crucible 13 and the metal steam pipeline 17 is $S_{inlet}$, wherein a ratio of $S_{outlet}$ to $S_{inlet}$ is greater than or equal to 0.05-5, i.e., $S_{outlet}/S_{inlet}\geq0.05\text{-}5$.

When being set to be of the slit type, the coating nozzle 21 has a straight or curved profile; or, when being set to be of the porous type, the coating nozzle 21 has a rectangular, circular, or trapezoidal profile or other profiles.

The coating nozzle 21 may be made of graphite, ceramic, or metal, or other materials that can be processed.

EMBODIMENT

Zinc evaporation coating on the surface of a steel plate 28 is adopted. The steel plate 28 has a width of 1000 mm, and the steel plate 28 is heated to 120° C. after washed and dried.

The crucible 13 is heated with the induction heater 16 to evaporate zinc. The pressure of zinc steam in the crucible 13 reaches 60000 Pa by controlling the power, and at the moment, the pressure regulating valve 23 is in the closed state. When the pressure of the steam in the crucible 13 reaches 60000 Pa, the pressure regulating valve 23 is opened and metal steam 15 enters the flow distribution tank body 18, in which the uniform mixing groove 19 and the pressure stabilizing plate 20 are arranged, through the metal steam pipeline 17.

A part of the metal steam 15 enters the uniform mixing groove 19, and the other part of the metal steam 15 bypasses the uniform mixing groove 19 and enters the buffer groove 26 inside the flow distribution tank body 18. $S_{inflow}/S_{overflow}=3$, the distance from the top of the deceleration wall 27 to the outer surface of the uniform mixing groove 19 is D2=8 mm, the number of the deceleration walls 27 is set to be eight, the deceleration wall 27 is of a continuous strip shape, the porosity P1 of the deceleration wall 27 is set to be 0.3, the distance between two adjacent deceleration walls 27 is DW=25 mm, and the resistance wires have the total power W1=8 KW/m.

The pressure stabilizing plate 20 is a baffle plate with a porous structure and having a certain thickness, and $S_{total\ hole\ area}/S_{outlet}=2.8$.

The working pressure inside the coating nozzle 21 is 55000 Pa. The coating nozzle 21 is made of graphite, and the outlet of the coating nozzle 21 is of the slit type and is rectangular, wherein $S_{outlet}/S_{inlet}=0.93$.

Those of ordinary skill in the art should realize that the above embodiments are merely used for illustrating the present application and not intended to limit the present application. Variations and modifications made to the above embodiments are intended to fall within the scope of the claims of the present application as long as they fall within the spirit of the present application.

The invention claimed is:

1. Vacuum coating apparatus for uniformly distributing a metal steam using a uniform mixing buffer structure, comprising a crucible, wherein an induction heater for heating a molten metal in the crucible to form the metal steam is arranged outside the crucible; a top of the crucible is connected to a flow distribution tank body by a metal steam pipeline; a uniform mixing groove and a pressure stabilizing plate, which extend in a horizontal direction, are arranged inside the flow distribution tank body; the uniform mixing groove is located below the pressure stabilizing plate; a coating nozzle is arranged on top of the flow distribution tank body; an induction coil is arranged outside the flow distribution tank body; a pressure regulating valve is arranged on the metal steam pipeline;

the uniform mixing groove is provided in a shape of a circular arc plate, and has a concave arc surface facing the metal steam pipeline; one or more heating holes extending in an axial direction of the uniform mixing groove are formed in the uniform mixing groove; a resistance wire is arranged inside each heating hole, the uniform mixing groove is provided with an overflow hole, and the overflow hole penetrates through the uniform mixing groove in a radial direction of the uniform mixing groove; and a buffer groove is formed in an inner wall of the flow distribution tank body, corresponds to the uniform mixing groove in position, and is provided with a plurality of deceleration walls therein.

2. The vacuum coating apparatus for uniformly distributing a metal steam using a uniform mixing buffer structure according to claim 1, wherein the buffer groove is arranged opposite to the uniform mixing groove in the horizontal direction such that the buffer groove corresponds to the uniform mixing groove in position.

3. The vacuum coating apparatus for uniformly distributing a metal steam using a uniform mixing buffer structure according to claim 1, wherein the overflow hole is provided as a circular hole, an elliptical hole, a trapezoidal hole or a rectangular hole.

4. The vacuum coating apparatus for uniformly distributing a metal steam using a uniform mixing buffer structure according to claim 3, wherein a plurality of overflow holes are provided, and include a combination of one or more of a circular hole, an elliptical hole, a trapezoidal hole or a rectangular hole.

5. The vacuum coating apparatus for uniformly distributing a metal steam using a uniform mixing buffer structure according to claim 1, wherein an overflow opening of the overflow hole is provided in a shape of a continuous overflow slit.

6. The vacuum coating apparatus for uniformly distributing a metal steam using a uniform mixing buffer structure according to claim 1, wherein a cross section of the buffer groove is set to be rectangular or trapezoidal.

7. The vacuum coating apparatus for uniformly distributing a metal steam using a uniform mixing buffer structure according to claim 1, wherein the deceleration walls are set to be of a rectangular strip shape or a trapezoidal strip shape with a porous structure.

8. The vacuum coating apparatus for uniformly distributing a metal steam using a uniform mixing buffer structure according to claim 7, wherein a number of the deceleration walls is 1-10.

9. The vacuum coating apparatus for uniformly distributing a metal steam using a uniform mixing buffer structure according to claim 1, wherein a total area $S_{overflow}$ of the overflow opening of the overflow hole in the uniform mixing groove, a total area $S_{inflow}$ of an airflow inlet channel of the uniform mixing groove, a distance D2 from the top of the deceleration walls to an outer surface of the uniform mixing groove, the number of the deceleration walls, a porosity P1 of the deceleration walls, a distance DW between two adjacent deceleration walls, a total power W1 of the resistance wires, and the pressure of the metal steam in the metal steam pipeline satisfy the following relationship:

the pressure of the metal steam in the metal steam pipeline is 5000-100000 Pa, $S_{inflow}/S_{overflow}=0.5-4$, D2=3-10 mm, DW=10-30 mm, the number of the deceleration walls is set to be 1-10, the deceleration walls are set to be of a continuous strip shape, the porosity of the deceleration walls are set to be 0.2-0.7, and the resistance wires have a total power W1=1-10 KW/m.

10. The vacuum coating apparatus for uniformly distributing a metal steam using a uniform mixing buffer structure according to claim 1, wherein a total area $S_{overflow}$ of the overflow opening of the overflow hole in the uniform mixing groove, a total area $S_{inflow}$ of the airflow inlet channel of the uniform mixing groove, a distance D2 from the top of the deceleration walls to the outer surface of the uniform mixing groove, the number of the deceleration walls, a porosity P1 of the deceleration walls, a distance DW between two adjacent deceleration walls, a total power W1 of the resistance wires, and the pressure of the metal steam in the metal steam pipeline satisfy the following relationship:

as the pressure of the metal steam in the metal steam pipeline is increased, a value of $S_{inflow}/S_{overflow}$ is increased, a value of D2 is increased, a value of DW is increased, the number of the deceleration walls is increased, the deceleration walls are set to be of a continuous strip shape, the porosity of the deceleration walls are reduced, and the total power W1 of the resistance wires is increased.

11. The vacuum coating apparatus for uniformly distributing a metal steam using a uniform mixing buffer structure according to claim 9, wherein, when the pressure of the metal steam in the metal steam pipeline is 50000-100000 Pa, $S_{inflow}/S_{overflow}$=2-4, D2=7-10 mm, DW=20-30 mm, the number of the deceleration walls is set to be 6-10, the deceleration walls are set to be of the continuous strip shape, the porosity of the deceleration walls are set to be 0.2-0.3, and the resistance wires have the total power W1=7-10 KW/m;

when the pressure of the metal steam in the metal steam pipeline is 10000-50000 Pa, $S_{inflow}/S_{overflow}$=1-2, D2=5-7 mm, DW=15-20 mm, the number of the deceleration walls is set to be 4-6, the deceleration walls are set to be of the continuous strip shape, the porosity of the deceleration walls are set to be 0.3-0.5, and the resistance wires have the total power W1=5-7 KW/m;

when the pressure of the metal steam in the metal steam pipeline is 5000-10000 Pa, $S_{inflow}/S_{overflow}$=0.5-1, D2=3-5 mm, DW=10-15 mm, the number of the deceleration walls is set to be 1-4, the deceleration walls are set to be of the continuous strip shape, the porosity of the deceleration walls are set to be 0.5-0.7, and the resistance wires have the total power W1=1-5 KW/m.

12. The vacuum coating apparatus for uniformly distributing a metal steam using a uniform mixing buffer structure according to claim 11, wherein the pressure stabilizing plate is set to be of a porous structure, and a ratio of a total hole area $S_{total\ hole\ area}$ of the pressure stabilizing plate to an airflow channel area $S_{outlet}$ at an outlet of the coating nozzle is greater than or equal to 0.1, such that $$S_{total\ hole\ area}/S_{outlet} \geq 0.1.$$

13. The vacuum coating apparatus for uniformly distributing a metal steam using a uniform mixing buffer structure according to claim 12, wherein the holes in the pressure stabilizing plate are circular, square or triangular.

14. The vacuum coating apparatus for uniformly distributing a metal steam using a uniform mixing buffer structure according to claim 13, wherein the holes in the pressure stabilizing plate extend in a straight or curved line.

15. The vacuum coating apparatus for uniformly distributing a metal steam using a uniform mixing buffer structure according to claim 1, wherein an outlet of the coating nozzle is set to be of a slit type or a porous type, and an airflow channel area at the outlet of the coating nozzle is $S_{outlet}$; an airflow channel area at an interface of the top of the crucible and the metal steam pipeline is $S_{inlet}$, wherein a ratio of $S_{outlet}$ to $S_{inlet}$ is greater than or equal to 0.05, such that $$S_{outlet}/S_{inlet} \geq 0.05.$$

16. The vacuum coating apparatus for uniformly distributing a metal steam using a uniform mixing buffer structure according to claim 15, wherein the coating nozzle is set to be of the slit type and has a straight or curved profile; or, the coating nozzle is of the porous type, and has a rectangular, circular or trapezoidal profile.

17. The vacuum coating apparatus for uniformly distributing a metal steam using a uniform mixing buffer structure according to claim 1, wherein the uniform mixing groove is connected to the flow distribution tank body by means of threads or inlaying.

18. The vacuum coating apparatus for uniformly distributing a metal steam using a uniform mixing buffer structure according to claim 10, wherein, when the pressure of the metal steam in the metal steam pipeline is 50000-100000 Pa, $S_{inflow}/S_{overflow}$=2-4, D2=7-10 mm, DW=20-30 mm, the number of the deceleration walls is set to be 6-10, the deceleration walls are set to be of the continuous strip shape, the porosity of the deceleration walls are set to be 0.2-0.3, and the resistance wires have the total power W1=7-10 KW/m;

when the pressure of the metal steam in the metal steam pipeline is 10000-50000 Pa, $S_{inflow}/S_{overflow}$=1-2, D2=5-7 mm, DW=15-20 mm, the number of the deceleration walls is set to be 4-6, the deceleration walls are set to be of the continuous strip shape, the porosity of the deceleration walls are set to be 0.3-0.5, and the resistance wires have the total power W1=5-7 KW/m;

when the pressure of the metal steam in the metal steam pipeline is 5000-10000 Pa, $S_{inflow}/S_{overflow}$=0.5-1, D2=3-5 mm, DW=10-15 mm, the number of the deceleration walls is set to be 1-4, the deceleration walls are set to be of the continuous strip shape, the porosity of the deceleration walls are set to be 0.5-0.7, and the resistance wires have the total power W1=1-5 KW/m.

* * * * *